(12) United States Patent
Miwa (10) Patent No.: US 6,522,384 B2
(45) Date of Patent: *Feb. 18, 2003

(54) EXPOSURE METHOD AND APPARATUS, AND DEVICE MANUFACTURING METHOD

(75) Inventor: Yoshinori Miwa, Utsunomiya (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/426,132

(22) Filed: Oct. 25, 1999

(65) Prior Publication Data

US 2002/0140915 A1 Oct. 3, 2002

(30) Foreign Application Priority Data

Oct. 27, 1998 (JP) .......................... 10-321431

(51) Int. Cl.[7] .......................... G03B 27/52; G03B 27/42
(52) U.S. Cl. .............................. 355/30; 355/53; 355/67
(58) Field of Search .............................. 355/30, 53, 67, 355/73; 359/355, 811; 353/101, 122, 121

(56) References Cited

U.S. PATENT DOCUMENTS

| 3,818,496 | A | * | 6/1974 | Lee et al. ................... 396/548 |
|---|---|---|---|---|
| 4,690,528 | A | * | 9/1987 | Tanimoto et al. ........... 353/101 |
| 5,430,303 | A | * | 7/1995 | Matsumoto et al. ...... 250/492.2 |
| 5,499,076 | A | * | 3/1996 | Muraki ......................... 355/53 |
| 5,559,584 | A | * | 9/1996 | Miyaji et al. ................. 355/73 |
| 5,602,683 | A | * | 2/1997 | Straaijer et al. ............ 359/811 |
| 5,699,183 | A | * | 12/1997 | Hiraiwa et al. ............. 359/355 |
| 5,892,572 | A | * | 4/1999 | Nishi ........................... 355/67 |
| 6,031,598 | A | * | 2/2000 | Tichenor et al. ............. 355/67 |
| 6,191,843 | B1 | * | 2/2001 | Takiguchi .................... 355/30 |
| 6,222,610 | B1 | * | 4/2001 | Hagiwara et al. ............ 355/30 |

FOREIGN PATENT DOCUMENTS

| JP | 6-204114 | 7/1994 |
|---|---|---|
| JP | 6-216000 | 8/1994 |
| JP | 9-162117 | 6/1997 |

* cited by examiner

Primary Examiner—Russell Adams
Assistant Examiner—Rodney Fuller
(74) Attorney, Agent, or Firm—Fitzpatrick, Cella, Harper & Scinto (57) ABSTRACT

An exposure apparatus includes a light source, one or two or more housings each for accommodating therein an optical element disposed along an exposure light path extending from the light source to a substrate, a first substitution system for substituting the interior of the housing with an inert gas ambience, and a second substitution system for substituting the interior of a holding mechanism for holding the optical element accommodated in the housing, with an inert gas ambience. The structure enables reduction in time for substitution of the exposure light path with an inert gas, and assures enlargement of a throughput of the exposure apparatus.

23 Claims, 9 Drawing Sheets

EXPOSURE METHOD AND APPARATUS, AND DEVICE MANUFACTURING METHOD

FIELD OF THE INVENTION AND RELATED ART

This invention relates generally to an exposure apparatus for projecting and printing a circuit pattern formed on a mask, onto a substrate being coated with a photosensitive material, in a reduced scale. More particularly, the invention is concerned with an exposure apparatus which uses deep ultraviolet light or an excimer laser as an exposure light source.

Reduction type projection exposure apparatuses are used in a process of manufacturing a semiconductor device which is formed with a very fine pattern such as LSI or VLSI. Miniaturization of a pattern has been required strongly due to increases in the integration density of a semiconductor device, and exposure apparatuses have been modified to meet such miniaturization, as well as improvements in a resist process.

The resolving power of an exposure apparatus can be improved by two methods, that is, a method in which the exposure wavelength is shortened, and a method in which the numerical aperture (NA) of a projection optical system is enlarged. Generally, the resolution is proportional to the exposure wavelength and it is inversely proportional to the NA. Besides the improvement of resolution, many attempts have been made to keep the depth of focus of a projection optical system. Generally, the depth of focus is proportional to the exposure wavelength, and it is inversely proportional to the square of the NA. Thus, improving the resolution and keeping the depth of focus are contradictory matters. As an attempt to solve such a problem, a phase shift method and a FLEX (Focus Latitude Enhancement Exposure) method, for example, have been proposed.

As regards the exposure wavelength, recently, KrF excimer lasers having an emission wavelength of about 248 nm are prevalently used in place of i-line of 365 nm. Also, ArF excimer lasers having an emission wavelength of about 193 nm are currently being developed, as a next generation exposure light source.

From the viewpoint of the production cost of a semiconductor device, further improvements in the throughput of an exposure apparatus have been attempted. For example, the power of an exposure light source is enlarged to thereby shorten the exposure time per one shot. Another example is enlarging the exposure area to thereby increase the number of chips per one shot.

In recent years, in order to meet the requirement of enlargement in chip size of a semiconductor device, the stream is shifting from step-and-repeat type exposure apparatuses (steppers) in which a mask pattern is printed sequentially in association with stepwise motion, to step-and-scan type exposure apparatuses in which a mask and a wafer are scanningly exposed in synchronism with each other, followed by stepwise motion to place a subsequent shot. In such step-and-scan type exposure apparatuses, the exposure field has a slit-like shape and, therefore, the exposure area can be enlarged without enlargement in size of the projection optical system.

Where ultraviolet light is used as an exposure light source, as described above, there may occur a phenomenon that, due to long-period use, ammonium sulfate ($NH_4$) or silicon dioxide ($SiO_2$) is deposited on the surface of an optical element disposed on the light path, to cause considerable degradation of the optical characteristic. The deposition is produced because of chemical reaction of ammonia ($NH_3$), sulfurous acid ($SO_2$) or silicon compound contained in the surrounding ambience caused in response to irradiation with ultraviolet light. In order to prevent such deterioration of optical elements, conventionally, the whole of the light path is purged by use of a clean dry air or an inert gas such as nitrogen.

As regards deep ultraviolet light, particularly, ArF excimer lasers having a wavelength of about 193 nm, it is known that there are plural absorbing bands for oxygen ($O_2$) in the bandwidth about that wavelength. Also, ozone ($O_3$) will be produced when oxygen absorbs light, and this ozone acts to increase light absorption, causing considerable decrease of transmission factor. Additionally, various products, as described above, attributable to the ozone will be deposited on the surface of an optical element, thus causing a decrease of the efficiency of the optical system.

In consideration of it, in an exposure optical system for projection exposure apparatuses having a deep ultraviolet light source such as an ArF excimer laser, for example, purge means using an inert gas such as nitrogen, for example, may be provided to keep the oxygen density along the light path at a low level.

Figure 8:
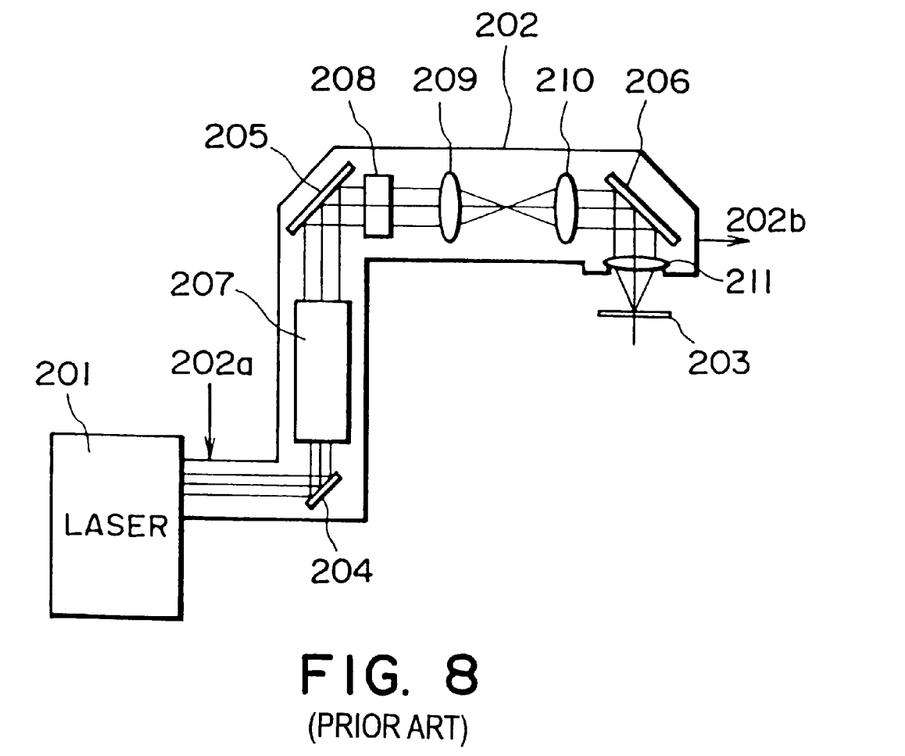
FIG. 8 is a schematic view of a conventional projection exposure apparatus.

An example of such inert gas purge means for an illumination optical system in a projection exposure apparatus, will be described with reference to FIG. 8.

As illustrated in the drawing, there are an excimer laser 201, and a container or housing 202 for the illumination optical system. Further, there are a reticle 203 and mirrors 204, 205 and 206. Denoted at 207 is a beam shaping optical system, and denoted at 208 is an optical integrator. Also, there are condenser lenses 209, 210 and 211.

A laser beam emitted by the excimer laser 201 is shaped by the beam shaping optical system 207 into a predetermined beam shape. Thereafter, the light enters the optical integrator 208 and, in response, secondary light sources (not shown) are produced near the light exit surface of the optical integrator 208. The light rays from the secondary light sources are directed through the condenser lenses 209, 210 and 211 to uniformly illuminate the reticle 203. Thus, the arrangement provides a Koehler illumination optical system.

In order to provide an inert gas ambience around the optical elements described above and along the light path of them, inert gas supply means (not shown) supplies a nitrogen gas, for example, into the housing 202 through a gas inlet port 202a. The thus applied inert gas flows through the interior of the illumination optical system. After substitution to remove any residual gas such as atmospheric gas, for example, the inert gas is discharged outwardly through a gas outlet port 202b, by gas discharging means (not shown).

The gas supply quantity may be controlled so as to minimize the substitution time by the inert gas, to thereby increase the system throughput, or minimize the consumption quantity of the inert gas after substitution, to thereby decrease the system running cost (Japanese Laid-Open Patent Application, Laid-Open No. 216000/1994).

On the other hand, a currently prevailing illumination method is a variation illumination method (e.g., Japanese Laid-Open Patent Application, Laid Open No. 204114/1994) wherein the distribution of the secondary light source as described above is changed in various ways. This is to accomplish both a high resolution and a large depth of focus. In order that the illumination condition is made variable, many optical elements of an illumination optical system should be made interchangeable. With the above-described inert gas substitution method, on that occasion, it is very difficult to forcibly substitute the inside space of a mechanism (barrel) for holding optical elements to be interchanged. Particularly, in a case where an ArF excimer laser having an emission wavelength about 193 nm is used, there is a problem, as described, that the light absorption occurs due to any oxygen remaining along the light path which causes a serious decrease of optical efficiency. Therefore, forcible substitution of the interior of the movable barrel, if desired, needs a complicated structure for the gas flow passageway, and it causes an increase of the system cost as well as prolongation of the time for completion of the substitution which results in a decrease of the system throughput.

SUMMARY OF THE INVENTION

It is accordingly an object of the present invention to accomplish reduction of a substitution time to an inert gas ambience along an exposure light path, still with a minimum cost, and thereby to increase the system throughput.

In accordance with an aspect of the present invention, there is provided an exposure apparatus, comprising: a light source; at least one (one or two or more) housing for accommodating therein an optical element disposed along an exposure light path extending from said light source to a substrate; first substitution means for substituting the interior of said housing with an inert gas ambience; and second substitution means for substituting the interior of a holding mechanism for holding the optical element accommodated in said housing, with an inert gas ambience.

The second substitution means may preferably include control means for controlling an inert gas supply quantity in accordance with the state of substitution of the inert gas ambience inside said holding mechanism and the state of substitution of the inert gas ambience inside said housing.

Each of the first and second substitution means may include control means for controlling an inert gas supply quantity, each control means being operable independently to set an inert gas supply quantity and a control operation timing.

The holding mechanism may comprise a barrel for movably holding said optical element in said housing.

The housing may accommodate therein the whole of or a portion of an illumination optical system for directing light from said light source to a reticle, and the holding mechanism may movably hold an optical element which may serve to variably or interchangeably set an illumination condition of said illumination optical system.

The housing may comprise a barrel for a projection optical system, and the holding mechanism may movably hold a lens inside said projection optical system, for variably or interchangeably setting an optical characteristic of said projection optical system.

The light source may comprise a light source of one of deep ultraviolet light and an excimer laser.

In accordance with another aspect of the present invention, there is provided a device manufacturing method including a process for producing a device by use of an exposure apparatus as recited above.

In accordance with a further aspect of the present invention, there is provided an exposure method, comprising the steps of: preparing at least one housing for accommodating therein an optical element disposed along an exposure light path extending from a light source to a substrate; substituting, by use of first substitution means, the interior of the housing with an inert gas ambience; and substituting, by use of second substitution means, the interior of a holding mechanism for holding the optical element accommodated in the housing, with an inert gas ambience, whereby the inside of the housing is substituted with an inert gas ambience.

In the exposure method described above, the second substitution means may be used to control an inert gas supply quantity in accordance with the state of substitution of the inert gas ambience inside the holding mechanism and the state of substitution of the inert gas ambience inside the housing.

Alternatively, each of the first and second substitution means may include control means for controlling an inert gas supply quantity, each control means being operable independently to set an inert gas supply quantity and a control operation timing.

Further, the holding mechanism may comprise a barrel for movably holding the optical element in the housing.

In the exposure method described above, the housing may accommodate therein the whole of or a portion of an illumination optical system for directing light from the light source to a reticle, and the holding mechanism may movably hold an optical element which may serve to variably or interchangeably set an illumination condition of the illumination optical system.

In the exposure method described above, the housing may comprise a barrel for a projection optical system, and wherein the holding mechanism movably holds a lens inside the projection optical system, for variably or interchangeably setting an optical characteristic of the projection optical system.

In the exposure method described above, the light source may comprise a light source of one of deep ultraviolet light and an excimer laser.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

[First Embodiment]

Figure 1:
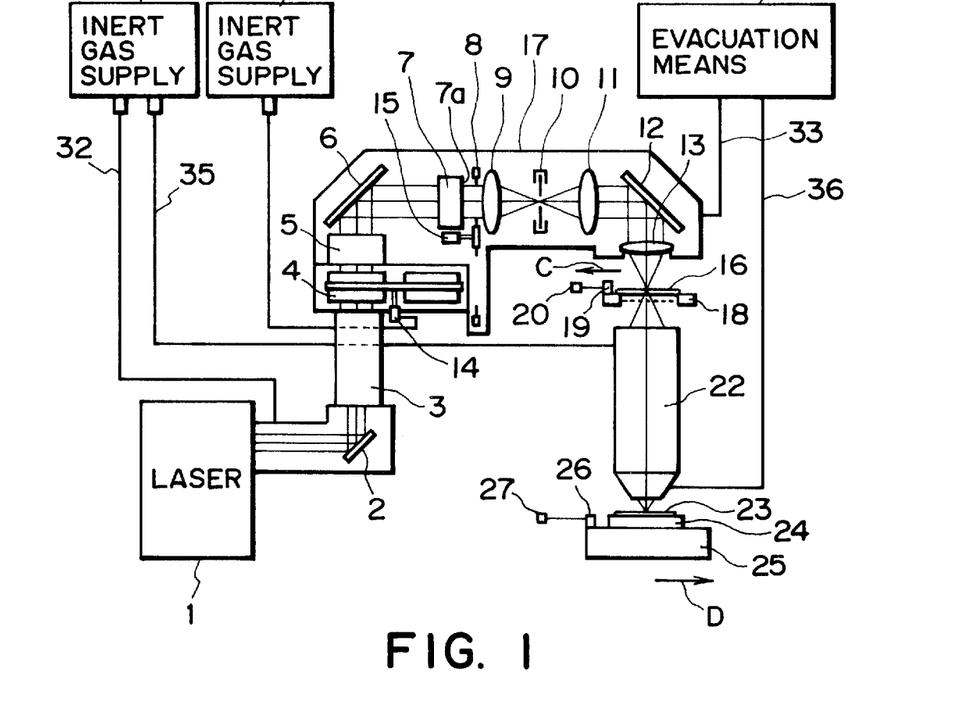
FIG. 1 is a schematic view of a projection exposure apparatus according to an embodiment of the present invention.

FIG. 1 shows a first embodiment of the present invention.

Denoted in the drawing at 1 is a deep ultraviolet light source such as an ArF excimer laser, for example, and denoted at 2 is a mirror. There are a beam shaping optical system 3 and an input lens 4. Further, there are an imaging lens 5, a mirror 6, an optical integrator 7, a stopper 8, a condenser lens 9, and a blind 10. Denoted at 11 is another condenser lens, and denoted at 12 is a mirror. Denoted at 13 is a condenser lens.

A laser beam emitted by the ArF excimer laser 1 is directed via the mirror 2 to the beam shaping optical system 3, by which the light is shaped into a predetermined beam shape. Thereafter, the light goes via the input lens 4, the imaging lens 5 and the mirror 6, and it enters the optical integrator 7 which comprises small lenses arrayed two-dimensionally. In response, secondary light source images are produced near the light exit surface 7a of the optical integrator 7. There is the stopper 8 disposed adjacent the plane where the secondary light sources are produced. Thus, by changing the stopper 8 by another in association with interchanging the input lens 4, a desired distribution of secondary light sources can be produced. Denoted at 14 and 15 are actuators for the switching drive of the input lens and the stopper, respectively.

The light from the secondary light sources is collected by the condenser lens 9. Adjacent a plane orthogonal to the optical axis and containing the point of light convergence defined by the condenser lens, there is the blind 10 disposed which functions to determine the illumination range for a mask 16. The light from the light convergence plane goes via the condenser lenses 11 and 13 and the mirror 12, such that a Koehler illumination optical system for illuminating the mask 16 uniformly is provided.

The whole illumination optical system described above is accommodated in a container or housing 17, so that they are isolated against gas communication with the outside atmosphere.

Denoted at 18 is a mask stage, and denoted at 19 is a mirror. Denoted at 20 is an interferometer, and denoted at 22 is a projection optical system. Denoted at 23 is a wafer, and denoted at 24 is a wafer chuck. Denoted at 25 is a wafer stage, and denoted at 26 is a mirror. Denoted at 27 is an interferometer.

Figure 2:
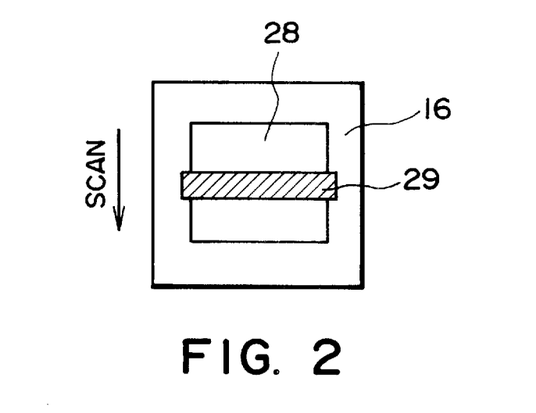
FIG. 2 is a schematic view for explaining scan exposure to be made in the exposure apparatus of FIG. 1.

As shown in FIG. 2, the illumination optical system described above serves to illuminate a portion of a pattern 28 formed on the mask 16, with slit-like light 29 (i.e., slit illumination). The portion of the pattern 28 is projected by the projection optical system 22 onto the wafer 23, in a reduced scale.

Here, the mask 16 and the wafer 23 are scanningly moved relative to the projection optical system 22 and the slit-like illumination 29, in opposite directions as depicted by arrows in the drawing, at a speed ratio corresponding to the reduction magnification of the projection optical system 22, while on the other hand multiple-pulse exposure based on the pulse light from the ArF excimer laser is repeated. In this manner, the whole pattern 28 on the mask 16 can be transferred to a single or plural chip regions on the wafer 23.

Referring back to FIG. 1, denoted at 18 is a mask stage for holding a mask 16 thereon. It can be scanningly moved in a direction of an arrow C, by means of a driving system (not shown). Denoted at 19 is a mirror fixedly mounted on the mask stage 18, and denoted at 20 is a laser interferometer for detecting the movement speed of the mask stage 18. Denoted at 24 is a wafer chuck for holding a wafer 23 thereon, and denoted at 25 is a wafer stage for holding the wafer chuck 24 thereon. It can be scanningly moved in a direction of an arrow D, by means of a driving system (not shown). Denoted at 26 is a mirror fixedly mounted on the wafer stage 25, and denoted at 27 is a laser interferometer for detecting the movement speed of the wafer stage 25.

Denoted at 31 is inert gas supplying means which operates, in this embodiment, to provide a gas supply to the housing 17 of the illumination optical system as well as to two locations in the projection optical system 22, as illustrated. The gas supply to the housing 17 of the illumination optical system is based on a supply system 32, connected to a portion near the laser emission end of the ArF excimer laser 1. Thus, the supplied gas flows along the laser light path while passing the optical elements sequentially, so that the gas inside the housing 17 is discharged outwardly. Finally, the gas is discharged outwardly, from a portion near the condenser lens 13 and through an evacuation system 33, by means of evacuation means 34.

The supply of an inert gas to the projection optical system 22 is made through a supply system 35 connected at an end of the projection optical system 22. The gas passes inside optical elements (not shown) sequentially, and it is discharged outwardly from the other end and through an evacuation system 36, by use of the evacuation means 34.

Denoted at 37 is another inert gas supplying means which operates, in this embodiment, to provide gas supply to the input lens 4, separately, with use of a supply system 38.

Figure 3:
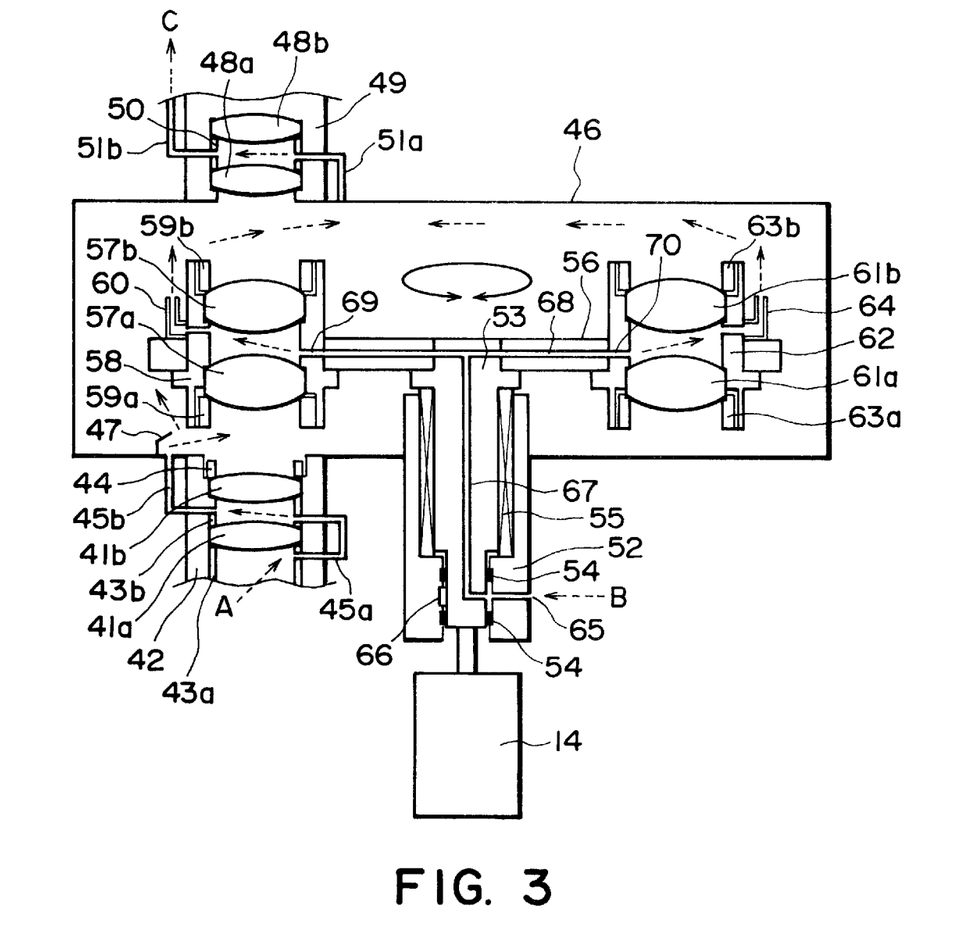
FIG. 3 is a schematic view for explaining details of an input lens portion in the exposure apparatus of FIG. 1.

FIG. 3 illustrates details of the input lens 4 and components around it. Denoted in the drawing at 41a–41b are optical elements, among the optical elements of the beam shaping optical system 3, described with reference to FIG. 1. Denoted at 42 is a case, and denoted at 43a and 43b are spacers. Denoted at 44 is a holding ring, and denoted at 45a–45b are pipings. Denoted at 46 is a container or housing, and denoted at 47 is a gas deflecting plate.

Denoted at 48a and 48b are optical elements, among the optical elements of the imaging lens system 5 having been described with reference to FIG. 1. Denoted at 49 is a case, and denoted at 50 is a spacer. Denoted at 51a and 51b are pipings.

Denoted at 14 is an actuator having been described with reference to FIG. 1. Denoted at 52 is a housing, and denoted at 53 is a shaft. Denoted at 54 is a sealing member, and denoted at 55 is a bearing. Denoted at 56 is a rotary plate. Denoted at 57a and 57b are first input lens elements, and denoted at 58 is a barrel. Denoted at 59a and 59b are holding rings, and denoted at 60 is a gas outlet port. Denoted at 61a and 61b are second input lens elements, and denoted at 62 is a barrel. Denoted at 63a and 63b are holding rings, and denoted at 64 is a gas outlet port.

The functions and operations of these components will be described with reference to FIG. 3.

As has been described with reference to FIG. 1, the light beam passing through the beam shaping optical system is shaped into a predetermined beam shape. The components of this optical system at a trailing end thereof are the optical elements 41a and 41b shown in FIG. 3. These optical elements 41a and 41b as well as the other optical elements (not shown) which are components of the beam shaping optical system are all accommodated in the case 42. In this embodiment, these elements are mounted in an order of the spacer 43a, the optical element 41a, the spacer 43b and the optical element 42b. Also, these elements are held fixed by means of the holding ring 44 which is thread-engaged with the inside circumferential surface of the case 42, at an end thereof. The case 42 and the spacers 43a and 43b are provided with gas communication bores. Thus, the inert gas flowing along the light path, from the light source side, reaches the optical element 43a portion as depicted by an arrow A in the drawing. Thereafter, the gas flows through the communication bores and the pipings 45a and 45b, so that it is directed into the housing 46 while performing inert gas substitution of the space for the optical elements 41a and 41b. The deflecting plate 47 is disposed so that the inert gas thus introduced can flow throughout the housing 46 without stagnation. The inert gas passed through the housing 46 is directed by means of a piping 51a to the space between the optical elements 48a and 48b and, after inert gas substitution of that space, it flows through a piping 51b toward a succeeding optical system (not shown).

These optical elements 48a and 48b as well as the other optical elements (not shown) which are components of the imaging lens system are all accommodated in the case 49. In this embodiment, these elements are mounted in an order of the optical element 48a, the spacer 50 and the optical element 48b. Also, these elements are held fixed inside the case 49, by use of fixing means (not shown). The connection between the case 42 and the housing 46 as well as the connection between the housing 46 and the case 42 are gas-tightly closed and isolated against gas communication with the outside atmosphere. Therefore, there occurs no outward leakage of the inert gas.

The first input lens elements 57a and 57b are mounted at opposite ends of the barrel 58, and they are held fixed by means of the holding rings 59a and 59b each being thread-engaged with the inside circumferential surface of the barrel 58, at an end thereof. Similarly, the second input lens elements 61a and 61b are mounted at opposite ends of the barrel 62, and they are held fixed by means of the holding rings 63a and 63b each being thread-engaged with the inside circumferential surface of the barrel 62, at an end thereof. The first input lens and the second input lens elements are provided by different optical elements. Thus, by selectively and interchangeably inserting either the first or second input lens into the laser light path, the intensity distribution of the laser beam impinging on the optical integrator 7 through the imaging lens 5 of FIG. 1, can be controlled.

The interchanging mechanism for the input lenses will now be described in detail.

The barrels 58 and 62 are fixedly mounted on the rotary plate 56. The rotary plate 56 is connected to the actuator 14 through the shaft 53. Further, the shaft 53 is supported by the housing 52 through the bearing 55. Also, the actuator 14 is fixedly mounted on a holder, not shown. The positioning of the first and second input lenses is performed by using an angular sensor (not shown) accommodated in the actuator.

The housing 52 is provided with a gas inlet port 65 to which a gas supply is made separately by the inert gas supplying means 37 shown in FIG. 1. An inert gas is thus supplied as depicted by an arrow B, and it is directed to an inside circumferential groove 66 which is formed in the inside circumferential surface of the housing 52 and which is communicated with the inlet port 65.

The shaft 53 is provided with a gas communication bore 67 being communicated with the groove 66. Thus, even when the shaft 53 rotates, the communication with the groove 66 is kept. There is a sealing member 54 as illustrated, between the shaft 53 and the housing 52, such that rotational motion can be made without leakage of inert gas in the communication between the groove 66 and the bore 67.

The gas communication bore 67 is further communicated with a communication bore 68 which is formed in the rotary plate 56. Thus, inert gases can be introduced through the communication bores 69 and 70 of the barrels 58 and 62, respectively, into the barrels 58 and 62, respectively. The gas having substituted the space between the first input lens elements 57a and 57b is discharged from a gas outlet port 60, while the gas having substituted the space between the second input lens elements 61a and 61b is discharged from a gas outlet port 64, respectively, both being directed into the housing 46.

As compared with the gas flow rate as supplied from the inert gas supply means 31 of FIG. 1 (arrow A), the gas flow rate as supplied from the inert gas supply means 37 of FIG. 1 (arrow B) is very small. Namely, while the gas of arrow A should function to perform the substitution of the inside of the housing 17 for the whole illumination optical system of FIG. 1, the gas of arrow B is used for the substitution of only the inside of the barrels 58 and 62 of the first and second input lenses. Thus, as compared with the inside volume of the housing 17, the inside volumes of the barrels 58 and 62 are very small. For this reason, there is substantially no possibility that the flow of gas discharged from the outlet ports 60 and 64 applies a large adverse influence to the flow of gas along the arrow A to cause a decrease of substitution efficiency. However, as regards the shape of the discharging ports 60 and 64, it should preferably be determined so as not to make the gas flow throughout the housing 46, unstable.

Details of the inert gas supply means 31 and 37 shown in FIG. 1 will now be described, with reference to FIG. 4.

Figure 4:
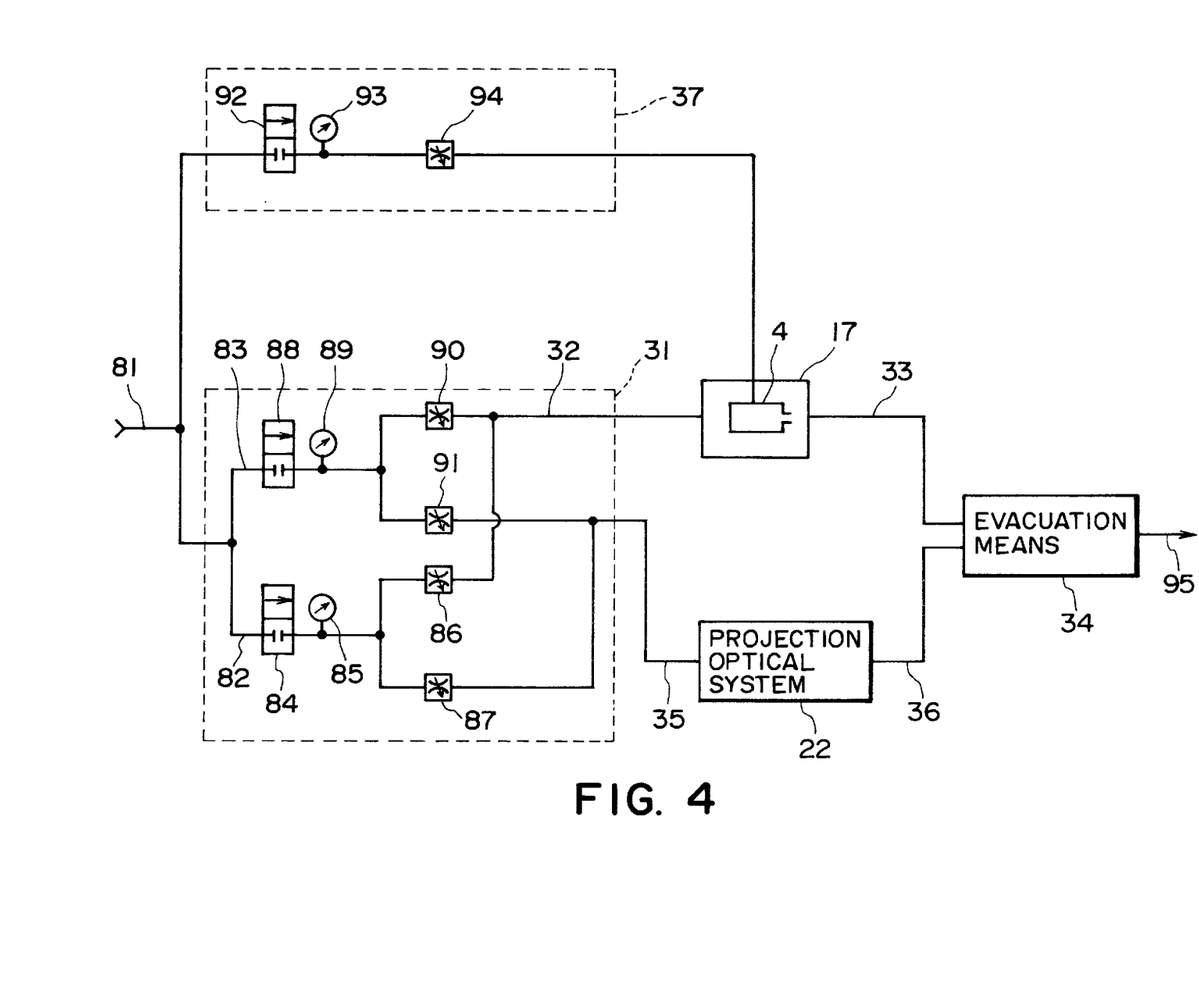
FIG. 4 is a schematic and diagrammatic view of an inert gas supplying and discharging system in the exposure apparatus of FIG. 1.

FIG. 4 is a block diagram of a system, from inert gas supply means to units to which gases should be supplied. Denoted at 81 is a gas supply line which is connected to a supply source (not shown) of nitrogen (inert gas). This line is forked into two, i.e., one connected to the inert gas supply means 31 and another connected to the inert gas supply means 37.

The inside structure of the inert gas supply means 31 will be described first. The gas supply line 81 is further separated into lines 82 and 83. The line 82 is connected to a first electromagnetic valve 84 and, after passing through a first pressure gauge 85, it is branched and connected to throttle valves 86 and 87, respectively. The gas flow rate setting for the throttles 86 and 87 will be described later. The throttle 86 is connected to the supply system 32, while the throttle 87 is connected to the supply system 35.

On the other hand, the line 83 is connected to a second electromagnetic valve 88 and, after passing through a second pressure gauge 89, it is branched and connected to throttle valves 90 and 91, respectively. The throttle 90 is connected to the supply system 32, while the throttle 91 is connected to the supply system 35.

Next, the inside structure of the inert gas supply means 37 will be described.

The line branched from the gas supply line 81 is connected to a third electromagnetic valve 92 and, after passing through a third pressure gauge 93, it is connected to a throttle valve 94.

As has been described with reference to FIG. 1, the supply system 32 is connected to the housing 17 which accommodates the whole illumination optical system therein, and, through the gas discharging system 33, it is connected to the gas evacuation means 34. Also, the supply system 35 is connected to the projection optical system 22 and, through the gas discharging system 36, it is connected to the evacuation means 34. The throttle valve 94 is connected to the input lens 4 disposed inside the housing 17 for the illumination optical system, and the gas from the input lens 4 is discharged through the housing 17 and through the discharging system 33, into the evacuation means 34.

The evacuation means 34 is, in turn, connected to an evacuation instrument (not shown) through an evacuation line 95.

The settings and operations of the components will be described below, in conjunction with FIG. 4.

The supply of nitrogen starts as the first and third electromagnetic valves 84 and 92 are opened in response to signals from a controller (not shown). Here, the second electromagnetic valve 88 is kept closed. The pressure gauges 85 and 93 are connected to the controller (not shown), and they function to check whether a predetermined pressure is reached as the first and third electromagnetic valves 84 and 92 are opened. If any disorder occurs in the gas supply system and the predetermined pressure is not accomplished, a signal of malfunction is applied to the controller, in response to which an appropriate reaction such as interruption of operation is made.

The throttles 86 and 87 are set to their optimum flow rate levels so that the gas, such as atmospheric air, inside the projection optical system can be substituted with nitrogen, in a necessary and shortest time.

As regards the throttle 94, the flow rate is set to such a level that the substitution of the inside of the input lens can be completed before the substitution of the housing 17 is accomplished as described above, thus substantially enabling the light emission of the ArF excimer laser.

The unshown controller operates to close the first and third electromagnetic valves 84 and 92 after an elapse of a predetermined time and, on the other hand, it operates to open the second electromagnetic valve 88. The pressure gauge 89 detects whether a predetermined gas pressure is reached or not as the second electromagnetic valve 88 is opened. If any disorder occurs in the gas supply system and the predetermined pressure is not accomplished, a signal of malfunction is applied to the controller, in response to which an appropriate reaction such as interruption of operation is made.

Since at that time the substitution of the interiors of the housing 17 and the projection optical system 22 with a nitrogen gas has been accomplished, nitrogen may thereafter be supplied at a level that maintains this substitution state. Thus, when the set flow rate of the throttle 86 is denoted by $Q_{86}$, and similarly the set flow rates of the throttles 87, 90 and 91 are denoted by $Q_{87}$, $Q_{90}$ and $Q_{91}$, respectively, then there may be relations of $Q_{90} < Q_{86}$ and $Q_{91} < Q_{87}$.

FIGS. 5A–5F schematically illustrate the nitrogen flow rate and changes in the state of nitrogen substitution, in accordance with the procedure described above.

Figure 5A:
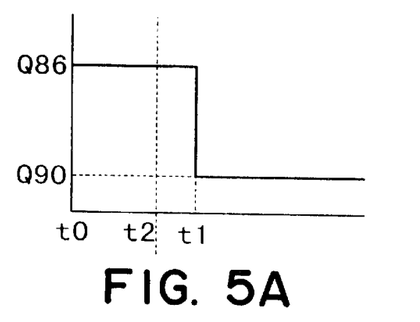
FIGS. 5A, 5B, 5C, 5D, 5E and 5F are graphs, respectively, for explaining a nitrogen flow rate and a change in the state of nitrogen substitution, in the exposure apparatus of FIG. 1.
Figure 5B:
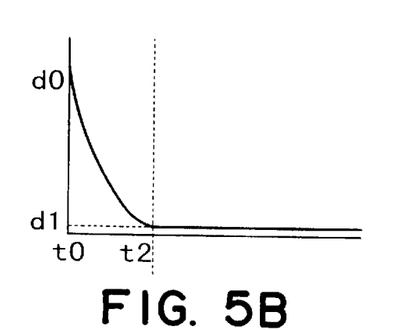

Among these drawings, FIG. 5A shows the quantity of nitrogen supply to the housing 17, wherein the axis of abscissa denotes time and the axis of ordinate denotes the nitrogen flow rate. At time $t_0$, the nitrogen supply starts. The flow rate is at $Q_{86}$ and is constant. At time $t_i$, the nitrogen flow rate is changed to $Q_{90}$. FIG. 5B shows changes in oxygen density, during this procedure, as an index of the state of nitrogen substitution inside the housing 17. The axis of abscissa denotes time, and the axis of ordinate denotes the oxygen density within the housing 17. The initial oxygen density at the nitrogen supply start time ($t_0$) is depicted as a level $d_0$, and the oxygen density with which the exposure process can be started substantially without any inconveniences is depicted as a level $d_1$. If the time where the oxygen density reaches the level $d_1$, is $t_2$, the timing for changing the nitrogen flow rate may be set to satisfy a relation that $t_2 \leq t_1$.

Figure 5C:
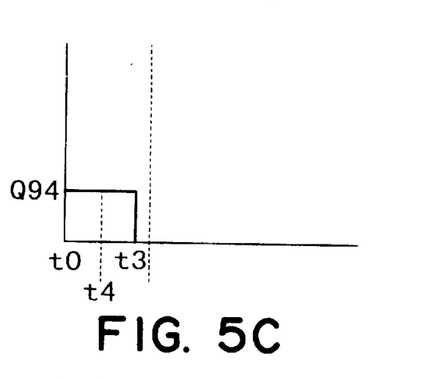
Figure 5D:
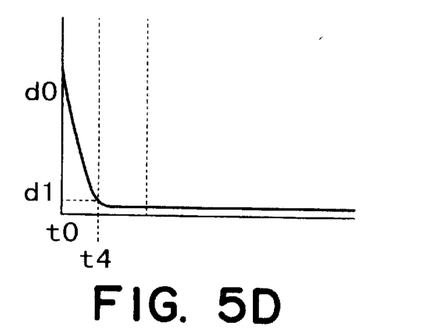

FIG. 5C shows the quantity of nitrogen supply to the input lens 4, and FIG. 5D shows changes in the oxygen density inside the input lens. In FIG. 5C, the nitrogen supply starts at time to. The flow rate is at a level $Q_{94}$, and it is constant. At time $t_3$, the nitrogen supply is interrupted. In FIG. 5D, the time where the oxygen density inside the input lens 4 reaches a level $d_1$ with which the exposure process can be started substantially without any inconveniences is denoted at $t_4$. The timing for changing the nitrogen flow rate may be set to satisfy a relation $t_4 \leq t_3$. It is seen from FIG. 5C that, even if the nitrogen supply is interrupted after time $t_3$, the ambience surrounding the input lens 4 is the nitrogen ambience because it is placed inside the housing 17, and that there does not occur undesirable degradation of the nitrogen substitution level.

Figure 5E:
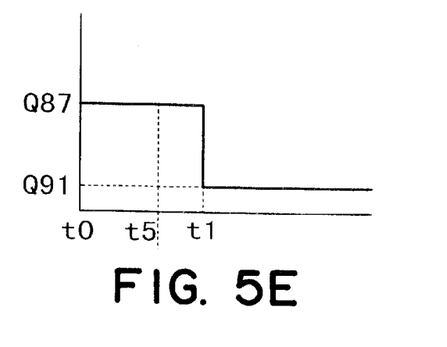
Figure 5F:
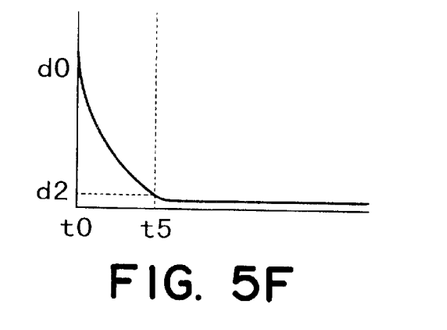

FIG. 5E shows the quantity of nitrogen supply to the projection optical system 22, and FIG. 5F shows changes in oxygen density inside the projection optical system 22. In FIG. 5E, the nitrogen supply starts at time $t_0$. The flow rate is at a level $Q_{87}$, and it is constant. At time $t_1$, the flow rate of nitrogen is changed to a level $Q_{94}$. In FIG. 5F, the time where the oxygen density inside the projection optical system 22 reaches a level $d_1$ with which the exposure process can be started substantially without any inconveniences is denoted at $t_5$. The timing for changing the nitrogen flow rate may be set to satisfy a relation $t_5 \leq t_1$.

As described above, if the time until a predetermined nitrogen substitution level is accomplished is predetected, the switching timing for the electromagnetic valves 86, 87, 90, 91 and 92 shown in FIG. 4 can be set in the controller, as desired. Further, if it is desired to best optimize the timing for changing the nitrogen flow rate to thereby reduce the nitrogen consumption, appropriate substitution level monitoring means such as an oxygen density gauge, for example, may be disposed inside the housing 17, the input lens 4 and/or the projection optical system 22, so that the nitrogen flow rate may be changed by the controller, in accordance with an output of the monitor.

Figure 6:
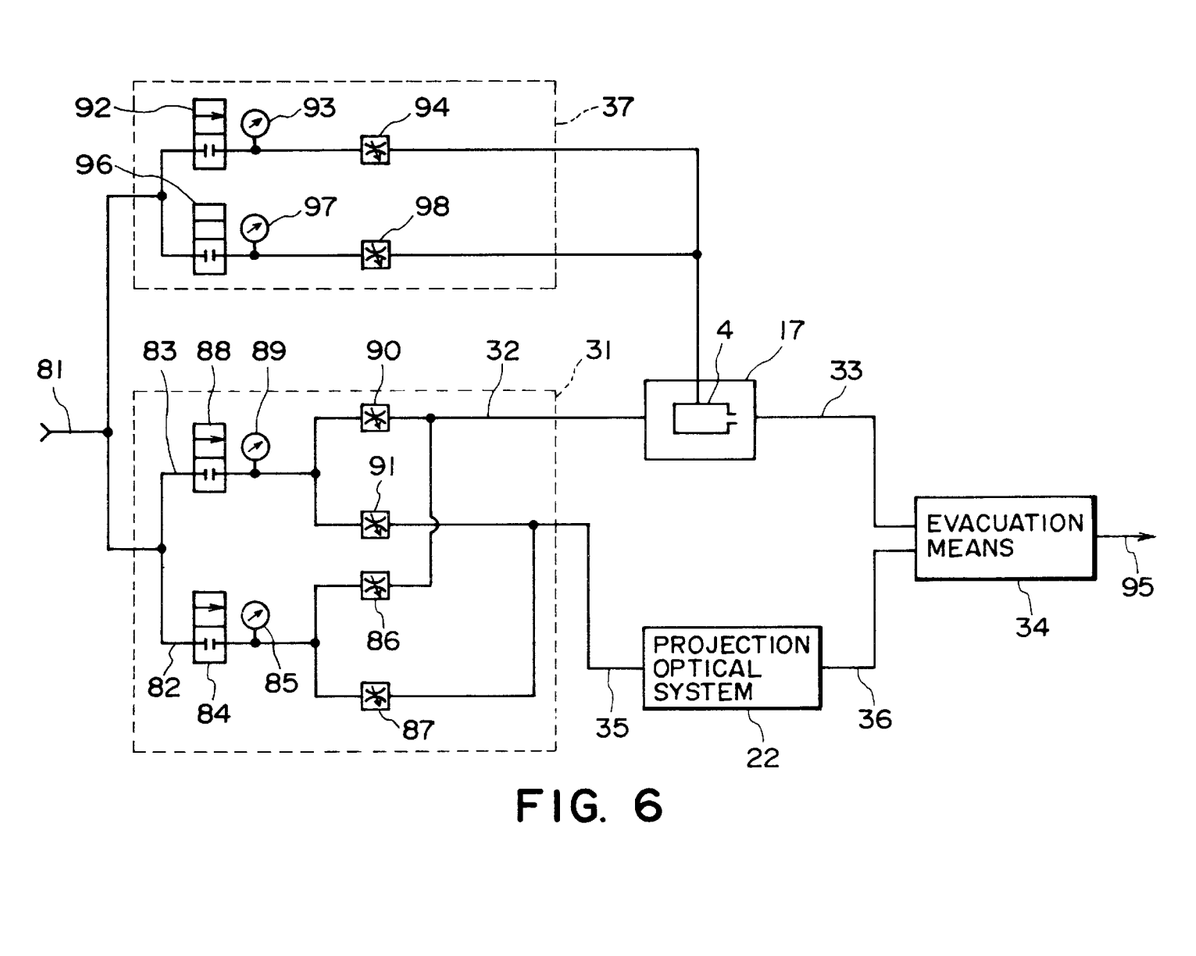
FIG. 6 is a schematic and diagrammatic view of a modified example of the gas supplying and discharging system of FIG. 4.

Further, while the description has been made above with reference to an example where the nitrogen supply to the input lens 4 is interrupted or stopped at a predetermined time, if it is desired to continue supply of a very small amount of nitrogen, rather than stopping the nitrogen supply, a structure such as shown in FIG. 6 may be used. In FIG. 6, components corresponding to those of FIG. 4 are denoted by like reference numerals. A description thereof will be omitted here.

In FIG. 6, denoted at 96 is a fourth electromagnetic valve, and denoted at 97 is a fourth pressure gauge. Denoted at 98 is a throttle valve. In this example, the nitrogen flow rate $Q_{94}$ through the throttle 94 and the nitrogen flow rate $Q_{98}$ through the throttle 98 may be placed in a relation $Q_{98} < Q_{94}$. As the third electromagnetic valve 92 is closed by the controller (not shown), the fourth electromagnetic valve 96 is opened, whereby a predetermined amount of nitrogen is supplied to the input lens 4.

[Second Embodiment]

Figure 7:
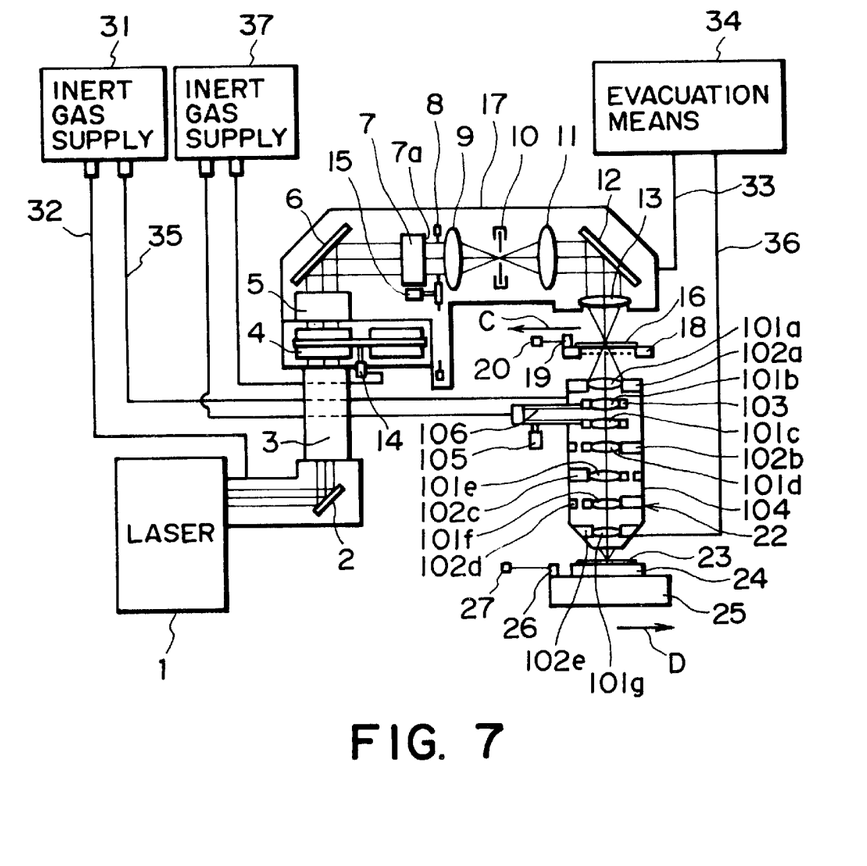
FIG. 7 is a schematic view of a projection exposure apparatus according to another embodiment of the present invention.

FIG. 7 shows an embodiment wherein, in addition to the structure of the embodiment shown in FIG. 1, a system for separate nitrogen supply to a space for a particular lens inside the projection optical system 22 is added. In FIG. 7, components corresponding to those of FIG. 1 are denoted by like reference numerals. A description thereof will be omitted here.

The projection optical system 22 has such a structure to be described below.

In FIG. 7, denoted at 101a–101g are lenses, and denoted at 102a–102e are lens holders. Denoted at 103 is a group holder. Denoted at 104 is a container or housing for the projection optical system, and denoted at 105 is an actuator. Denoted at 106 is a connector.

The lens 101a is held by the lens holder 102a. Similarly, the lenses 101d, 101e, 101f and 101g are held by the lens holders 102b, 102c, 102d and 102e, respectively. Also, the lenses 101b and 101c are held by the group holder 103, and they can be moved along an optical axis direction by means of the actuator 105, for correction of aberration of the projection optical system 22. The actuator 105 is connected to the group holder 103, through the connector 106.

In this embodiment, the inert gas supply means 31 operates to supply a gas into the projection optical system housing 104, at a portion near the top end of the housing. Through gas communication bores formed in the lens holders 102b, 102c and 102d, nitrogen substitution is performed sequentially to the lens spaces. Finally, the gas is discharged to the evacuation means 34. Further, the inert gas supply means 37 functions to supply nitrogen into the group holder 103. After nitrogen substitution of the space between the lenses 101b and 101c is accomplished, the gas is discharged into the housing 104 through a gas communication bore formed in the group holder 103. Subsequently, like that described above, the gas passes sequentially through the lens spaces through gas communication bores formed in the lens holders, and finally it is discharged to the evacuation means 34. As has been described with reference to the embodiment of FIG. 1, also in this embodiment, the flow rate of nitrogen from the inert gas supply means 37 is very small as compared with the nitrogen flow rate from the inert gas supply means 31. For this reason, there is substantially no possibility that a gas discharged from the group holder 103 disturbs the flow of nitrogen inside the housing 104.

As regards the nitrogen supply to the group holder 103, the supply may be stopped in a predetermined time period, like the first embodiment. Alternatively, the flow rate may be changed to a low level, rather than stopping the same.

While two embodiments of the present invention have been described above, the object to which an inert gas should be supplied separately from the inert gas supply means 37 is not limited to an optical element which is to be driven, as described. For example, the separate inert gas supply may be made to any location where inert gas substitution is not easy because of the disposition of an optical element or elements or of any structure around it.

Further, while the foregoing description has been made with reference to examples where nitrogen is used as an inert gas, any other inert gas may of course be used, with a result of similar advantageous effects of the invention.

[Third Embodiment]

Next, an embodiment of a semiconductor device manufacturing method which uses an exposure apparatus such as described above, will be explained.

Figure 9:
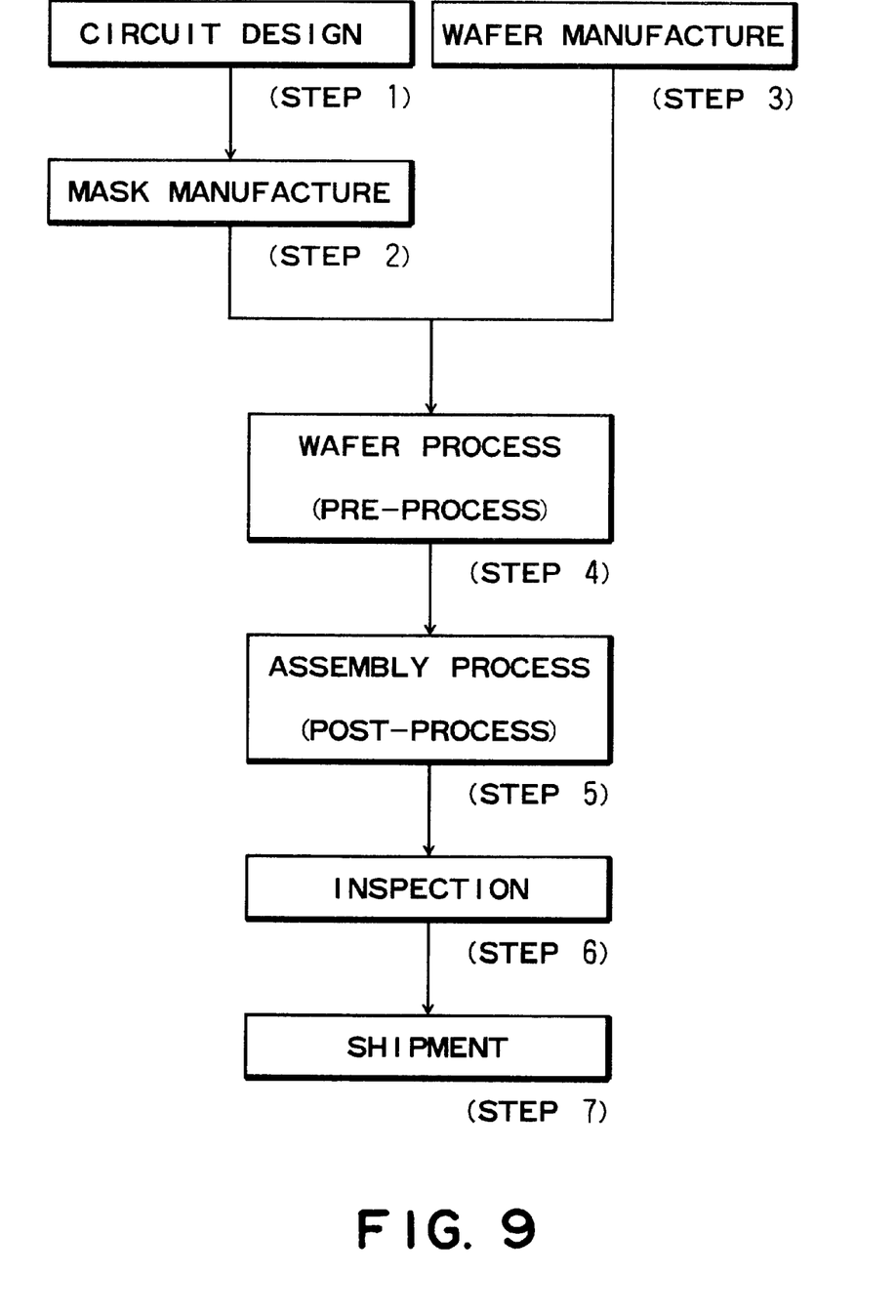
FIG. 9 is a flow chart of microdevice manufacturing processes.

FIG. 9 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 10:
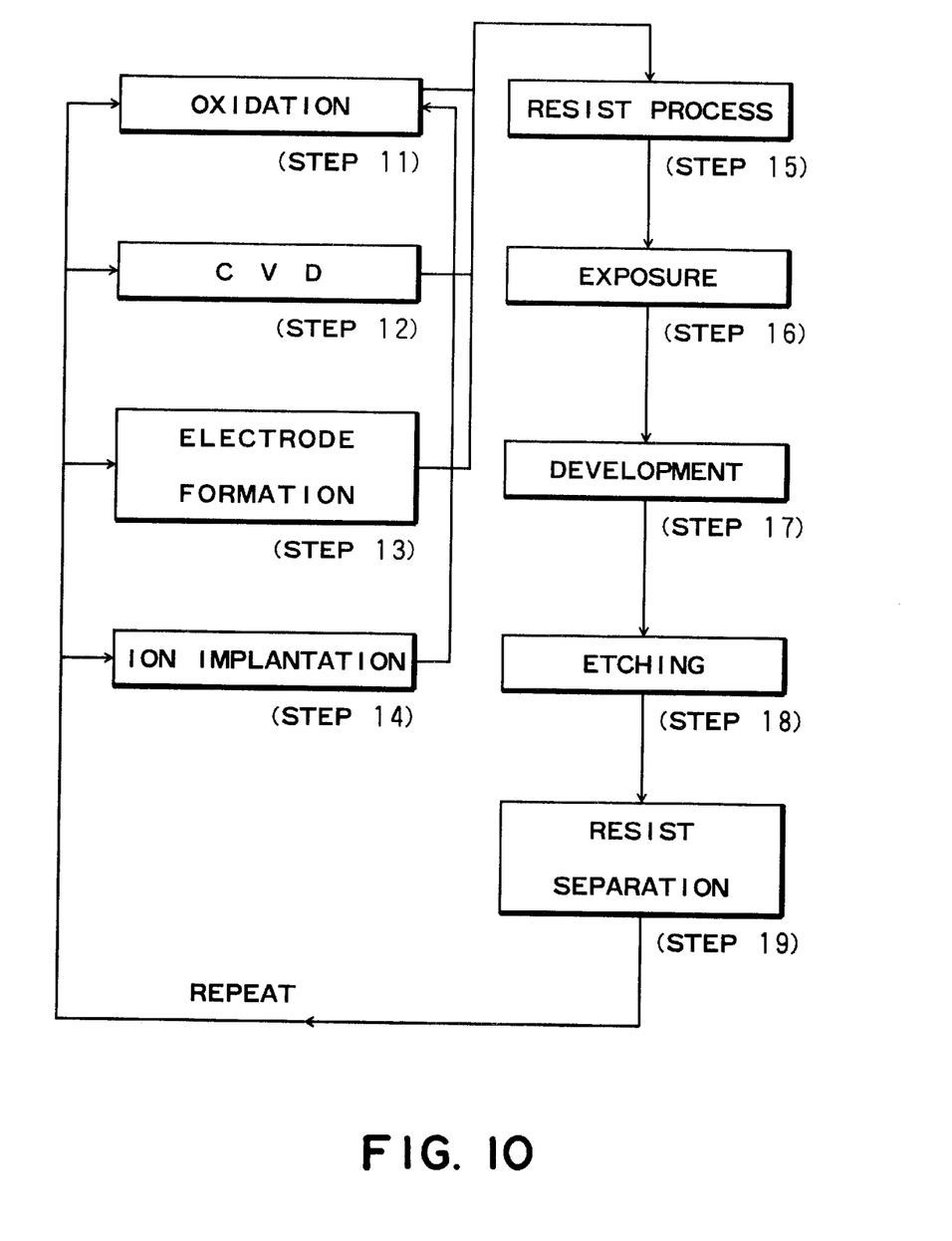
FIG. 10 is a flow chart for explaining details of a wafer process in the procedure shown in FIG. 9.

FIG. 10 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed water. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured at a lower cost.

In accordance with the embodiments of the present invention as described hereinbefore, inert gas substitution along an exposure light path can be performed satisfactorily. Consequently, the present invention can provide an exposure apparatus of higher efficiency and a higher throughput.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:

a light source;

at least one optical system for accommodating therein an optical element disposed along an exposure light path extending from said light source to a substrate;

an optical unit for holding said optical element accommodated in said at least one optical system;

first substitution means for substituting the interior of said at least one optical system with an inert gas ambience; and second substitution means for substituting the interior of said optical unit with an inert gas ambience.

2. An apparatus according to claim 1, wherein said second substitution means includes control means for controlling an inert gas supply quantity in accordance with the state of substitution of the inert gas ambience inside said optical unit and the state of substitution of the inert gas ambience inside said optical system.

3. An apparatus according to claim 1, wherein each of said first and second substitution means includes control means for controlling an inert gas supply quantity, each control means being operable independently to set an inert gas supply quantity and a control operation timing.

4. An apparatus according to claim 1, wherein said optical unit comprises a barrel for movably holding said optical element in said optical system.

5. An apparatus according to claim 1, wherein said optical system accommodates therein the whole of or a portion of an illumination optical system for directing light from said light source to a reticle, and wherein said optical unit movably holds an optical element which serves to variably or interchangeably set an illumination condition of said illumination optical system.

6. An apparatus according to claim 1, wherein said optical system comprises a barrel for a projection optical system, and wherein said optical unit movably holds a lens inside said projection optical system, for variably or interchangeably setting an optical characteristic of said projection optical system.

7. An apparatus according to claim 1, wherein said light source comprises a light source of one of deep ultraviolet light and an excimer laser.

8. An exposure method, comprising the steps of:
providing at least one housing for accommodating therein an optical element disposed along an exposure light path extending from a light source to a substrate;
substituting, by use of first substitution means, the interior of the housing with an inert gas ambience; and
substituting, by use of second substitution means, the interior of a holding mechanism for holding the optical element accommodated in the housing, with an inert gas ambience,
whereby the inside of the housing is substituted with an inert gas ambience.

9. A method according to claim 8, further comprising controlling, with the second substitution means, an inert gas supply quantity in accordance with the state of substitution of the inert gas ambience inside the holding mechanism and the state of substitution of the inert gas ambience inside the housing.

10. A method according to claim 8, wherein each of the first and second substitution means includes control means for controlling an inert gas supply quantity, and further comprising operating each control means independently to set an inert gas supply quantity and a control operation timing.

11. A method according to claim 8, wherein the holding mechanism comprises a barrel for movably holding the optical element in the housing.

12. A method according to claim 8, wherein the housing accommodates therein the whole of or a portion of an illumination optical system for directing light from the light source to a reticle, and further comprising movably holding with the holding mechanism an optical element which serves to variably or interchangeably set an illumination condition of the illumination optical system.

13. A method according to claim 8, wherein the housing comprises a barrel for a projection optical system, and further comprising movably holding with the holding mechanism a lens inside the projection optical system, for variably or interchangeably setting an optical characteristic of the projection system.

14. A method according to claim 8, wherein the light source comprises a light source of one of deep ultraviolet light and an excimer laser.

15. An exposure apparatus, comprising:
at least one housing for accommodating therein an optical element disposed along an exposure light path;
a holding mechanism having a barrel for movably holding said optical element in said housing;
first substitution means for substituting the interior of said housing with a prescribed gas ambience; and
second substitution means for substituting the interior of said holding mechanism with a prescribed gas ambience.

16. An apparatus according to claim 15, wherein said prescribed gas ambience is an inert gas ambience.

17. An apparatus according to claim 15, wherein said second substitution means includes control means for controlling an inert gas supply quantity in accordance with the state of substitution of the inert gas ambience inside said holding mechanism and the state of substitution of the inert gas ambience inside said housing.

18. An apparatus according to claim 15, wherein each of said first and second substitution means includes control means for controlling an inert gas supply quantity, each control means being operable independently to set an inert gas supply quantity and a control operation timing.

19. An apparatus according to claim 15, wherein said housing accommodates therein the whole of or a portion of an illumination optical system for directing light from said light source to a reticle, and wherein said holding mechanism movably holds an optical element which serves to variably or interchangeably set an illumination condition of said illumination optical system.

20. An apparatus according to claim 15, wherein said housing comprises a barrel for a projection optical system, and wherein said holding mechanism movably holds a lens inside said projection optical system, for variably or interchangeably setting an optical characteristic of said projection optical system.

21. An apparatus according to claim 15, wherein said light source comprises a light source of one of deep ultraviolet light and an excimer laser.

22. A device manufacturing method comprising:
emitting an exposure beam from an exposure light source;
accommodating in at least one optical system an optical element disposed along an exposure light path extending from the light source to a substrate;
holding, with an optical unit, the optical element accommodated in the at least one optical system;
substituting, with first substitution means, the interior of the at least once optical system with an inert gas ambience; and
substituting, with second substitution means, the interior of the optical unit with an inert gas ambience.

23. A device manufacturing method, comprising:
accommodating in at least one housing an optical element disposed along an exposure light path;
movably holding, with a holding mechanism having a barrel, the optical element in the housing;
substituting, with first substitution means, the interior of the housing with a prescribed gas ambience; and
substituting, with second substitution means, the interior of the holding mechanism with a prescribed gas ambience.

* * * * *

UNITED STATES PATENT AND TRADEMARK OFFICE
CERTIFICATE OF CORRECTION

PATENT NO.    : 6,522,384 B2
DATED         : February 18, 2003
INVENTOR(S)   : Yoshinori Miwa It is certified that error appears in the above-identified patent and that said Letters Patent is hereby corrected as shown below:

<u>Column 14,</u>
Line 46, "once" should read -- one --.

Signed and Sealed this

Thirtieth Day of September, 2003

JAMES E. ROGAN
*Director of the United States Patent and Trademark Office*